United States Patent
Eickelmann et al.

(10) Patent No.: US 9,755,099 B2
(45) Date of Patent: Sep. 5, 2017

(54) INTEGRATED MICRO-INVERTER AND THIN FILM SOLAR MODULE AND MANUFACTURING PROCESS

(71) Applicant: GLOBALFOUNDRIES INC, Grand Cayman (KY)

(72) Inventors: Hans-Juergen Eickelmann, Mainz (DE); Ruediger Kellman, Mainz (DE); Hartmut Kuehl, Gau-Bischofsheim (DE); Markus Schmidt, Seibersbach (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 121 days.

(21) Appl. No.: 13/966,516

(22) Filed: Aug. 14, 2013

(65) Prior Publication Data

US 2015/0047686 A1 Feb. 19, 2015

(51) Int. Cl.
*H01L 31/18* (2006.01)
*H01L 31/042* (2014.01)
(Continued)

(52) U.S. Cl.
CPC ........ *H01L 31/18* (2013.01); *H01L 21/02565* (2013.01); *H01L 27/142* (2013.01);
(Continued)

(58) Field of Classification Search
CPC ... H01L 31/042; H01L 31/0504; H01L 31/05; H01L 31/18; H01L 27/142;
(Continued)

(56) References Cited

U.S. PATENT DOCUMENTS

| 4,217,633 A | 8/1980 | Evans, Jr. |
| 5,637,187 A | 6/1997 | Takasu et al. |

(Continued)

FOREIGN PATENT DOCUMENTS

| JP | 2002353487 | 6/2002 |
| WO | 2010000855 A2 | 1/2010 |

OTHER PUBLICATIONS

Esram, Trishan, and Patrick L. Chapman. "Comparison of Photovoltaic Array Maximum Power Point Tracking Techniques." IEEE Transactions on Energy Conversion 22.2 (2007): 439-49. Print.*

(Continued)

*Primary Examiner* — Devina Pillay
*Assistant Examiner* — Daniel Malley, Jr.
(74) *Attorney, Agent, or Firm* — Scully, Scott, Murphy & Presser, PC

(57) ABSTRACT

Embodiments of the present invention include a method for manufacturing, and a structure for a thin film solar module. The method of manufacturing includes fabricating a thin film solar cell and fabricating an electronic conversion unit (ECU) on a single substrate. The thin film solar cell has at least one solar cell diode on a substrate. The ECU has at least one transistor on the substrate. The ECU may further comprise a capacitor and an inductor. The ECU is integrated on the substrate monolithically and electrically connected with the thin film solar cell. The ECU and the thin film solar cell interconnect to form a circuit on the substrate. The ECU is electrically connected to a microcontroller on the solar cell module.

8 Claims, 10 Drawing Sheets

(51) Int. Cl.

| | |
|---|---|
| *H01L 31/05* | (2014.01) |
| *H02J 3/38* | (2006.01) |
| *H01L 27/142* | (2014.01) |
| *H02S 40/32* | (2014.01) |
| *H01L 21/02* | (2006.01) |
| *H01L 29/66* | (2006.01) |
| *H01L 29/786* | (2006.01) |
| *H01L 31/0224* | (2006.01) |
| *H01L 31/072* | (2012.01) |

(52) U.S. Cl.
CPC .... *H01L 29/66969* (2013.01); *H01L 29/7869* (2013.01); *H01L 31/022441* (2013.01); *H01L 31/042* (2013.01); *H01L 31/0504* (2013.01); *H01L 31/072* (2013.01); *H01L 31/1884* (2013.01); *H02J 3/385* (2013.01); *H02S 40/32* (2014.12); *Y02B 10/14* (2013.01); *Y02E 10/50* (2013.01)

(58) Field of Classification Search
CPC .............. H01L 27/1421; H01L 31/0445; H01L 31/044; H02J 3/385; H02J 3/38; H02S 40/32; H02S 40/30
See application file for complete search history.

(56) References Cited

U.S. PATENT DOCUMENTS

| | | | |
|---|---|---|---|
| 6,593,521 B2 | 7/2003 | Kobayashi | |
| 8,264,808 B2 | 9/2012 | Yun | |
| 8,604,330 B1 * | 12/2013 | Hennessy et al. | ............ 136/201 |
| 2003/0008437 A1 | 1/2003 | Inoue et al. | |
| 2007/0000535 A1 | 1/2007 | Mesmer et al. | |
| 2007/0227579 A1 | 10/2007 | Buller et al. | |
| 2008/0078444 A1 | 4/2008 | Atanackovic | |
| 2009/0308446 A1 | 12/2009 | Lin et al. | |
| 2010/0206378 A1 | 8/2010 | Erickson, Jr. et al. | |
| 2012/0085384 A1 | 4/2012 | Beitel et al. | |
| 2012/0256181 A1 * | 10/2012 | Shieh et al. | ................... 257/57 |
| 2012/0262948 A1 | 10/2012 | Lee et al. | |
| 2013/0192656 A1 * | 8/2013 | Hardin et al. | ................ 136/244 |

OTHER PUBLICATIONS

Imtiaz et al., "All-in-One Photovoltaic Power System: Features and Challenges Involved in Cell-Level Power Conversion in ac Solar Cells", Digital Object Identifier 10.1109/MIAS.2012.2215658, Date of publication: Apr. 26, 2013, pp. 1-23.

International Searching Authority, Application No. PCT/EP2014/063333, International filing date Jun. 25, 2014.

U.S. Appl. No. 14/157,962, entitled "An Integrated Micro-Inverter and Thin Film Solar Module and Manufacturing Process" filed Jan. 17, 2014.

Li, et al., "Integrating Photovoltaic and Power Converter Characteristics for Energy Extraction Study of Solar PV Systems", Renewable Energy, vol. 36, Issue 12, Dec. 2011, pp. 3238-3245.

Office Action dated Nov. 9, 2015 received in related U.S. Patent Application, namely U.S. Appl. No. 14/157,962.

Office Action dated Mar. 25, 2015, received in a related U.S. Appl. No. 14/157,962.

* cited by examiner

INTEGRATED MICRO-INVERTER AND THIN FILM SOLAR MODULE AND MANUFACTURING PROCESS

FIELD OF THE INVENTION

The present invention relates generally to the field of photovoltaic cells, and more particularly to thin film solar cells.

BACKGROUND OF THE INVENTION

Solar cells are photovoltaic devices which convert sunlight into electricity. Solar cells are made of crystalline silicon (c-Si) wafer based solar cells or thin film solar cells. Crystalline silicon solar cells are made from bulk materials cut into wafers, typically between 180 and 240 micrometers thick, which are then processed like traditional semiconductors. Thin film solar cell materials, for example amorphous silicon (a-Si) or copper indium gallium selenide (CIGS), are manufactured on a glass or plastic backing using vacuum processes including co-evaporation and sputtering. CIGS material strongly absorbs sunlight such that a much thinner film is required compared to a-Si or the traditional c-Si material. Because of this, a CIGS layer is thin enough to be applied to flexible substrates.

The solar power industry continuously strives to improve both the efficiency of the individual solar cell and of the overall solar module or array. A solar array is a collection of solar panels or solar modules wherein solar cells are linked together first in series to obtain the desired voltage, and then series strings are linked in parallel to produce more current. The solar module environment includes a power converter system which includes an inverter to convert the DC current into alternating current (AC) to power a home directly, or to be sent to the public power grid. The inverter may also transform and reshape the voltage to match the public power grid.

To maximize power output of a solar module, solar arrays use one of many different maximum power point tracking (MPPT) techniques. MPPT devices are typically integrated into a power converter system which provides voltage or current conversion, filtering, and regulation for driving various loads in power grids, and batteries. Individual solar cells have nonlinear output efficiency due to the relationship between solar irradiation, temperature, and total resistance. The maximum power point for a solar cell may be found by analyzing the curve of current to voltage. In general, the MPPT varies the system voltage to find the maximum power point for the cell or module measured. MPPT may be applied to the solar module, to solar sub-modules, or to solar cells directly. The more MPPT devices, the greater efficiency overall, but an increase in MPPT devices leads to an increase in system installation costs. Currently, the costs of installation at the solar cell level do not outweigh the benefits of the greater number of MPPT devices.

A pulse width modulator (PWM) may be used to control the amount of power delivered to a load while minimizing losses. PWM devices are integrated into the power converter system of the solar module. PWM functions by quickly switching the power on and off to reduce the power output. PWM with filters may also be used to condition the power output waveform to match the phase of the public power grid.

SUMMARY

Embodiments of the present invention include a method for manufacturing, and a structure for a thin film solar module. The method of manufacturing includes fabricating a thin film solar cell and fabricating an electronic conversion unit (ECU) on a single substrate. The thin film solar cell has at least one solar cell diode on a substrate. The ECU has at least one transistor on the substrate. The ECU may further comprise a capacitor and an inductor. The ECU is integrated on the substrate monolithically and electrically connected with the thin film solar cell. The ECU and the thin film solar cell interconnect to form a circuit on the substrate. The ECU is electrically connected to a microcontroller on the solar cell module.

DETAILED DESCRIPTION

Figure 1:
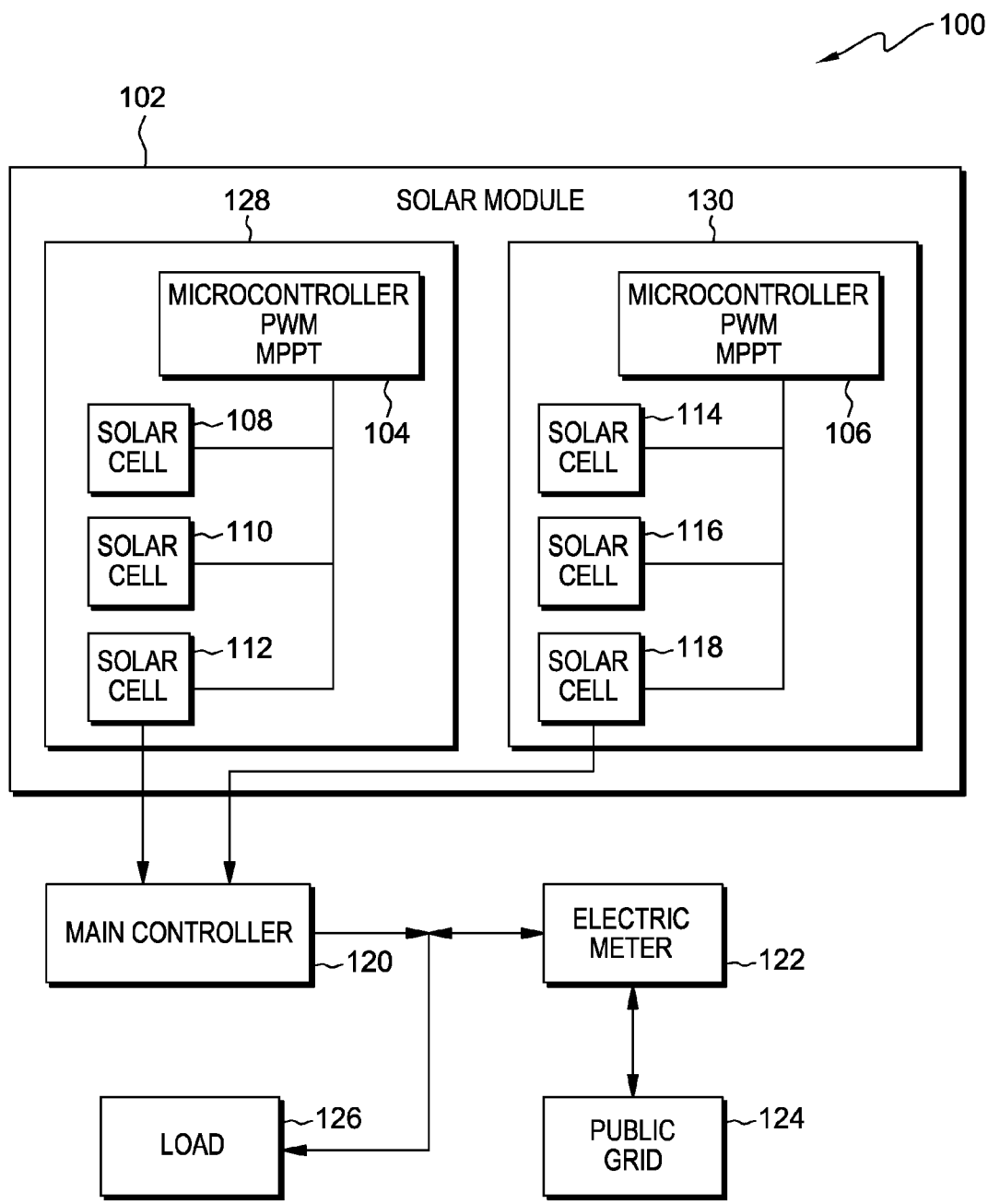
FIG. 1 depicts a solar cell module environment containing an embodiment of the present invention.

In a balance of system (BOS), the improved performance of solar arrays is balanced against the cost of the system. Solar module environment designs employ MPPT techniques to solar modules or to solar cells to get the maximum possible power output. MPPT at the solar cell level adds significant cost to the owner due to the extra cost of components and installation. When a string of diodes or solar cells are connected in series in order to meet a target voltage, the diode in the string with the worst characteristics, from diode manufacturing variability or intermittent shading of the diode, may reduce the overall output of the string of diodes. Embodiments of the present invention recognize connecting each solar cell or string of solar cells to a separate micro-inverter with MPPT capability to maximize power output may negatively affect the BOS. Toward these ends, embodiments of the present invention integrate power conversion electronics into the thin film solar cell manufacturing process allowing optimization of the BOS with enhanced system performance at lower cost and reducing the effort for system assembly.

A metal oxide material available for use in thin film transistor (TFT) manufacturing, amorphous InGaZnO (a-IGZO), can be used to replace the a-Si based technology as transistor dimensions get further reduced for higher resolution displays and lower energy consumption on touch screens for hand held devices. A-IGZO material may be used in a metal oxide semiconductor field-effect transistor (MOSFET) with 40× higher electron mobility compared to a-Si. Embodiments of the present invention combine manufacturing materials and processes from both thin film solar cells and thin film transistors to build new solar cells integrated monolithically with power conversion electronics. Certain embodiments use a-IGZO to create TFT devices that are compatible with thin film solar cell manufacturing methods.

Embodiments of the invention may take a variety of forms, and exemplary implementation details are discussed subsequently with reference to the Figures. The method steps described below do not form a complete process flow for manufacturing thin film solar cells or modules. Since present embodiments can be practiced in conjunction with the thin film solar cell fabrication techniques and thin film transistor fabrication techniques currently used in the art, only a limited number of commonly practiced process steps are included, as necessary, for an understanding of the described embodiments. The Figures represent cross-section portions of a thin film solar cell during fabrication and are not drawn to scale. Instead the Figures are drawn to illustrate the features of the described embodiments. Specific structural and functional details disclosed herein are not to be interpreted as limiting, but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

The terminology used herein is for the purpose of describing particular embodiments only and is not intended to be limiting of the invention. As used herein, the singular forms "a", "an" and "the" are intended to include the plural forms as well, unless the context clearly indicates otherwise. It may be further understood that the terms "comprises" or "comprising," when used in this specification, specify the presence of stated features, integers, steps, operations, elements, or components, but do not preclude the presence or addition of one or more other features, integers, steps, operations, elements, components, or groups thereof.

The descriptions of the various embodiments of the present invention have been presented for purposes of illustration, but are not intended to be exhaustive or limited to the embodiments disclosed. Many modifications and variations may be apparent to those of ordinary skill in the art without departing from the scope and spirit of the described embodiments. Thus, the present invention is not limited to the embodiments shown, but is to be accorded the widest scope consistent with the principles and features disclosed herein.

Figure 2:
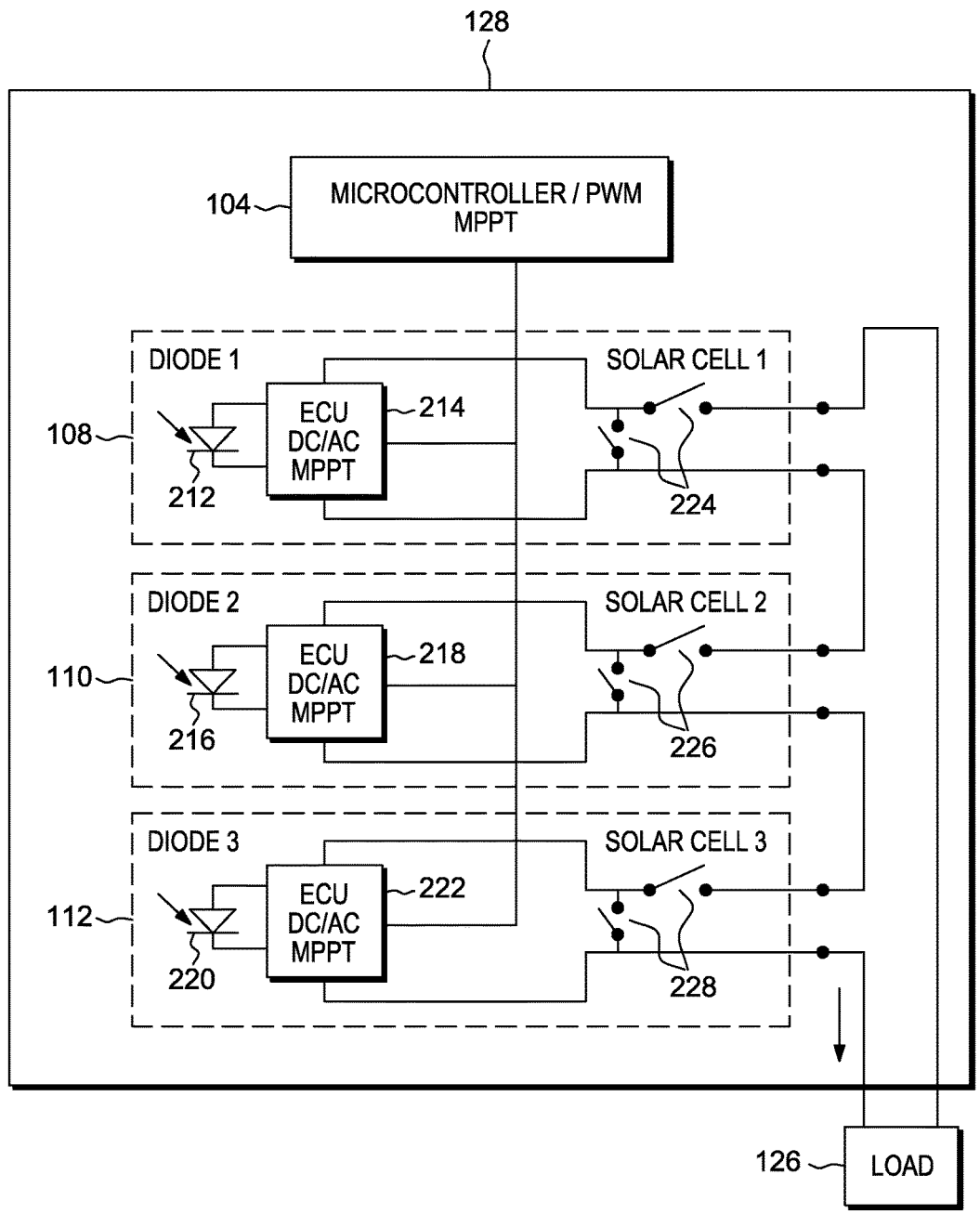
FIG. 2 illustrates details of the solar cells inside a solar sub-module, in accordance with an embodiment of the present invention.

The present invention will now be described in detail with reference to the Figures. FIGS. 1 and 2 represent an exemplary embodiment of the present invention. FIG. 1 depicts a solar module environment, generally designated 100, containing an embodiment of the present invention. Solar module environment 100 includes solar module 102, main controller 120, electric meter 122, public grid 124, and load 126.

In FIG. 1, the depiction of solar module 102 includes a number of solar sub-modules, such as solar sub-module 128 and 130. In general, solar module 102 may include any combination of solar cells, such as solar cell 108, microcontrollers, such as microcontroller 104, solar sub-modules, such as solar sub-module 128, and the associated wiring. Each solar sub-module contains a number of solar cells. Solar sub-module 128 contains solar cells 108, 110, and 112, and solar sub-module 130 contains solar cells 114, 116, and 118. In solar sub-module 128, microcontroller 104 connects to each solar cell in the depicted module, i.e., solar cells 108, 110, and 112. In solar sub-module 130, microcontroller 106 connects to each solar cell, i.e., solar cells 114, 116 and 118. Each solar sub-module of a given solar module may contain multiple sets of solar cells connected to microcontrollers, and the present invention is not limited to the depiction of FIG. 1. In another embodiment, the solar cells of both solar sub-module 128 and 130 are connected to a single microcontroller. For example, in solar module 102, microcontroller 104 connects to all depicted solar cells, i.e., solar cells 108, 110, 112, 114, 116, and 118, while microcontroller 106 does not exist. The number of solar cells connected to each microcontroller may depend on the electrical requirements of the solar module, the circuit design, the layout of the solar cells, or on the physical configuration of the solar cells on the thin film solar absorber substrate material, or a combination thereof. Exemplary components of solar cells, such as solar cells 108, 110, and 112, are described in greater detail in FIG. 2.

In one embodiment of the present invention, solar module 102 passes DC current, generated by solar sub-modules 128 and 130, to main controller 120. Main controller 120 converts the DC current to AC current and modifies the AC current to meet requirements of public grid 124 or load 126. From main controller 120, the AC current may flow directly to load 126, or the current may flow to electric meter 122 and then on to public grid 124. Electric meter 122 allows current to flow in either direction under different circumstances. During the day when power produced by solar module 102 exceeds any local load, the excess current may be sent to a power grid, such as public grid 124. At night, when solar module 102 does not produce electricity, the current may flow from public grid 124 through electric meter 122 and then on to load 126 as needed. Load 126 is any device that uses DC or AC current. For example, load 126 may be one or more of: a home electrical system, battery storage system, a direct use device such as a light, and any other resistive load.

Main controller 120 may be a hardware device physically separate from solar module 102, or in another embodiment, main controller 120 may be fully integrated into solar module 102. For example, main controller 120 may be integrated into solar module 102 through the use of micro-inverters within each solar cell as detailed further in FIG. 2. In such a scenario, the micro-inverters convert the DC current to AC current without the need of a stand-alone conversion unit. A combination of one or more ECU's and one or more microcontrollers act as a main controller performing PWM, power conversion, and power conditioning prior to passing an output to a public grid or a current using device.

In another embodiment of the present invention, solar module environment 100 may not contain connections to electric meter 122 and public grid 124. For example, load 126 may be a direct use device that does not require conversion of DC current to AC current. In such a case, micro-inverters may still modify the DC current for use by load 126. A person of ordinary skill in the art may recognize there are many configurations of solar cell modules, controllers and loads which exist beyond the simple form shown here in FIG. 1.

FIG. 2 illustrates details of the solar cells inside solar sub-module 128. Solar sub-module 128 includes a set of solar cells connected in series with each solar cell containing a diode and an energy converter, in accordance with an embodiment of the present invention. Solar cells 108, 110, and 112, each contain a solar diode, such as diodes 212, 216, and 220 respectively. Solar cells 108, 110, and 112, each contain an electronic conversion unit, such as electronic conversion unit 214, 218, and 222 respectively. The ECU comprises a micro-inverter circuit which performs one or more of: maximum power point tracking (MPPT), power conversion, and power conditioning, at the solar cell level. A single electronic conversion unit includes an integrated micro-inverter for power conversion and MPPT built on the substrate with the solar diode. For example, electronic conversion unit 214 includes an integrated micro-inverter for power conversion and MPPT manufactured on a single substrate with diode 212 in solar cell 108. The micro-inverter performs MPPT on diode 212 to provide maximum DC current possible given any limitations of diode 212. In the same manner, electronic conversion unit 218 sits on the substrate with diode 216 in solar cell 110, and electronic conversion unit 222 sits on the substrate with diode 220 in solar cell 112. In a preferred embodiment of the present invention, solar cells 108, 110, and 112 are all on a single substrate material. The integrated micro-inverter may convert the DC current into conditioned DC current or the DC current into AC current depending on the needs of solar module environment 100. For example, electronic conversion unit 214 and 218 output DC current, while electronic conversion unit 222 outputs AC current. A person skilled in the art will recognize a string of solar cells may be longer or shorter than depicted to meet the target voltage of a solar module environment, such as solar module environment 100.

Each electronic conversion unit of a solar cell connects to a microcontroller unit within a solar module or solar sub-module, i.e., solar sub-module 128. A microcontroller comprises a circuit connected to the ECU which performs one or more of: pulse width modulation (PWM), MPPT, power conversion, and power conditioning, at a solar sub-module or solar module level. In FIG. 2, electronic conversion units 214, 218, and 222 connect to microcontroller 104. Microcontroller 104 performs pulse width modulation (PWM) to control the relative phases in between sub-modules, similar to micro-inverters on the solar cell level. Microcontroller 104 performs MPPT on the sub-module. PWM and MPPT are performed by sending digital signals to open or close transistor switches inside the electronic conversion unit. In an embodiment of the present invention, microcontroller 104 may be monolithically integrated into a single substrate with diode 212 and electronic conversion unit 214. In another embodiment of the present invention, microcontroller 104 may be external to the substrate of diode 212, but integrated with solar module 102. In an embodiment of the present invention, the string of solar cells 108, 110, and 112 passes the final AC current directly to load 126. Load 126 may be replaced by or in addition to a connection to electric meter 122 and public grid 124.

In an embodiment of the present invention, solar cell 108 may contain additional transistors, such as switches 224. For example, in this embodiment solar cell 110 has switches 226, and solar cell 112 has switches 228. The additional transistors may physically be part of the electronic conversion unit, but the diagram shows them outside for clarity. Microcontroller 104 sends digital signals to control switches 224 within a micro-inverter device, such as electronic conversion unit 214 inside solar cell 108. By controlling the transistors, or switches, diodes may be added together in series to create a DC current waveform with a chosen frequency. The resultant DC current waveform may be converted into AC current by a switching unit converting a positive half period into a negative voltage half period inside a micro-inverter device, i.e., electronic conversion unit 222, or a main controller, i.e., main controller 120 (see FIG. 1). In another embodiment, switches 224, 226 and 228 may not exist in solar sub-module 128, and waveform conversion may take place in main controller 120 instead.

Figure 3:
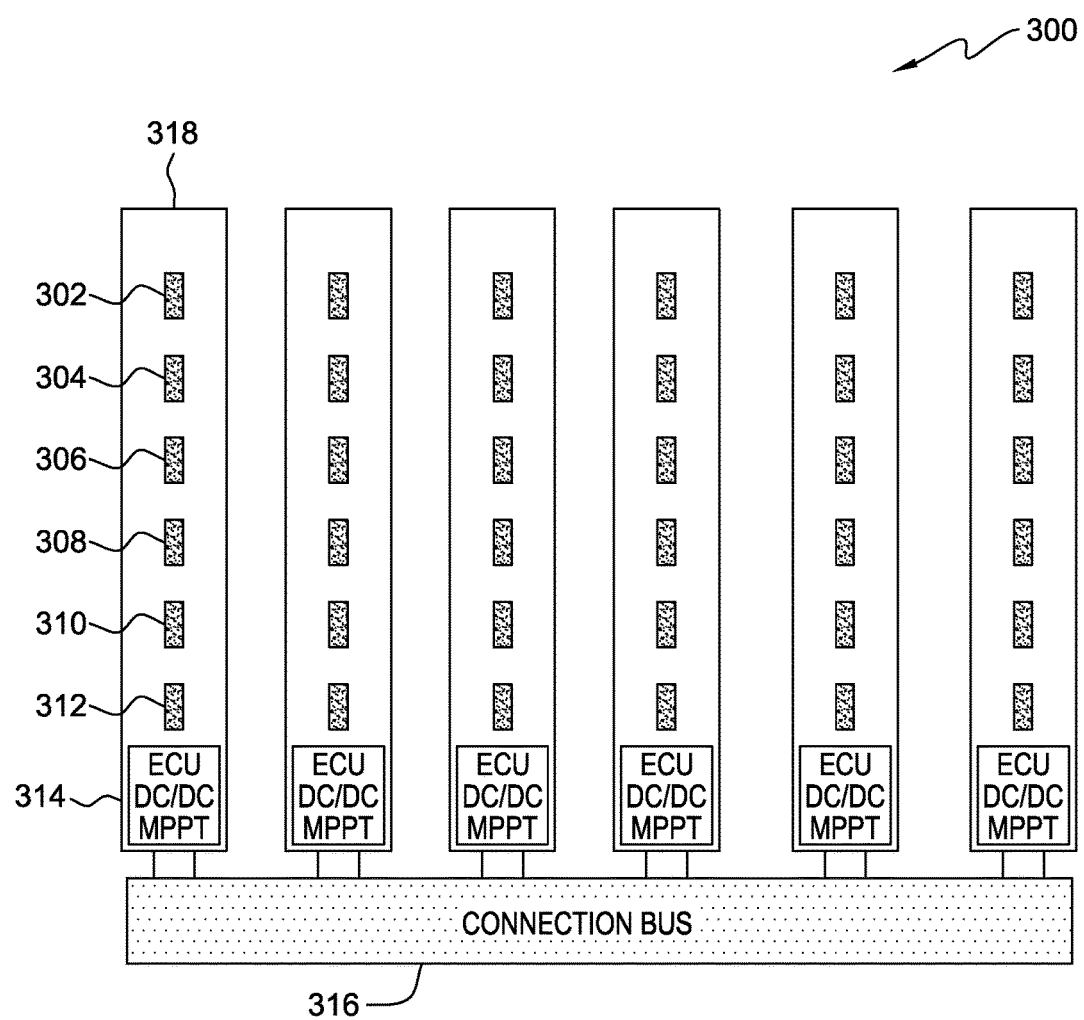
FIG. 3 illustrates a solar cell module separated into strings, in accordance with an embodiment of the present invention.

FIG. 3 illustrates a solar module separated into strings, generally designated 300, in accordance with an embodiment of the present invention. Solar cells or diodes connect in series within a string inside a solar module to provide a desired system voltage. The length of the string depends on the characteristics of each diode and the target system voltage. Solar module 300 may comprise one or more solar cell strings, such as solar cell string 318, connected to connection bus 316. Connection bus 316 may be a standard DC bus passing DC current from all the strings. In certain embodiments of the present invention, a solar cell string includes a set of diodes connected in series and an electronic conversion unit. For example, solar cell string 318 includes a set of diodes connected in series, such as diodes 302, 304, 306, 308, 310, and 312 along with electronic conversion unit 314 as shown in FIG. 3. Electronic conversion unit 314 sits at the end of solar cell string 318 between the diodes and connection bus 316. In a preferred embodiment of the present invention, electronic conversion unit 314 includes an integrated micro-inverter for power conversion and MPPT manufactured on a single substrate with diodes 302, 304, 306, 308, 310, and 312. Electronic conversion unit 314 conditions or converts the DC current, and through MPPT maximizes the DC current to the maximum DC current possible by solar cell string 318 based on the limitations of diodes 302, 304, 306, 308, 310, and 312.

Figure 4A:
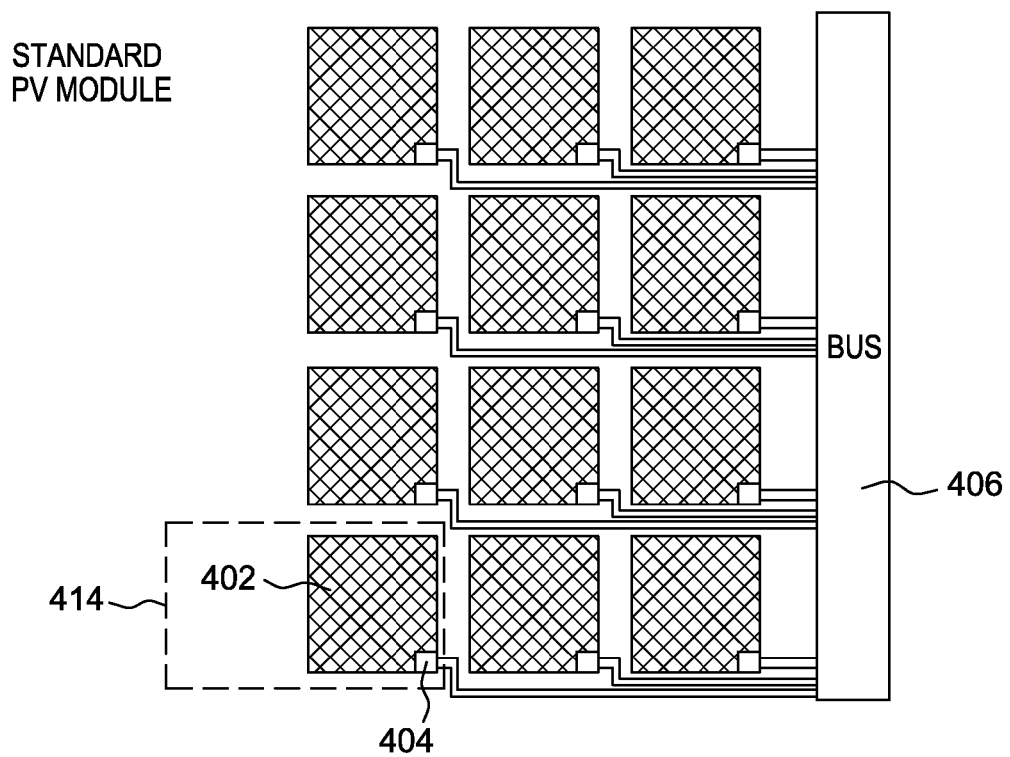
FIG. 4a illustrates a solar module separated into pixels, in accordance with an embodiment of the present invention.

FIG. 4a illustrates a solar module separated into pixels or square cells, in accordance with an embodiment of the present invention. The solar cell module is separated into a plurality of pixels. Each pixel having a solar cell diode connected to a single electronic conversion unit manufactured on a single substrate. For example, diode 402 and ECU 404 are manufactured on a single substrate. Each pixel connects through wiring to a power collecting layer, such as collector bus 406. Collector bus 406 may be a standard DC bus passing DC current from all the pixels. For example, ECU 404 includes an integrated micro-inverter for power conversion and MPPT manufactured on a single substrate as diode 402 in solar cell 414. The micro-inverter performs MPPT on diode 402 to provide the maximum DC current possible given any limitations of diode 402. In a standard solar module without concentrating lenses, the area of absorber material, such as diode 402, needs to be maximized on the solar module to provide the optimum collection area for sunlight. The area loss to ECU 404 may be minimized by using thin film display manufacturing methods to integrate power conversion and MPPT circuitry directly on the solar cell substrate.

Figure 4B:
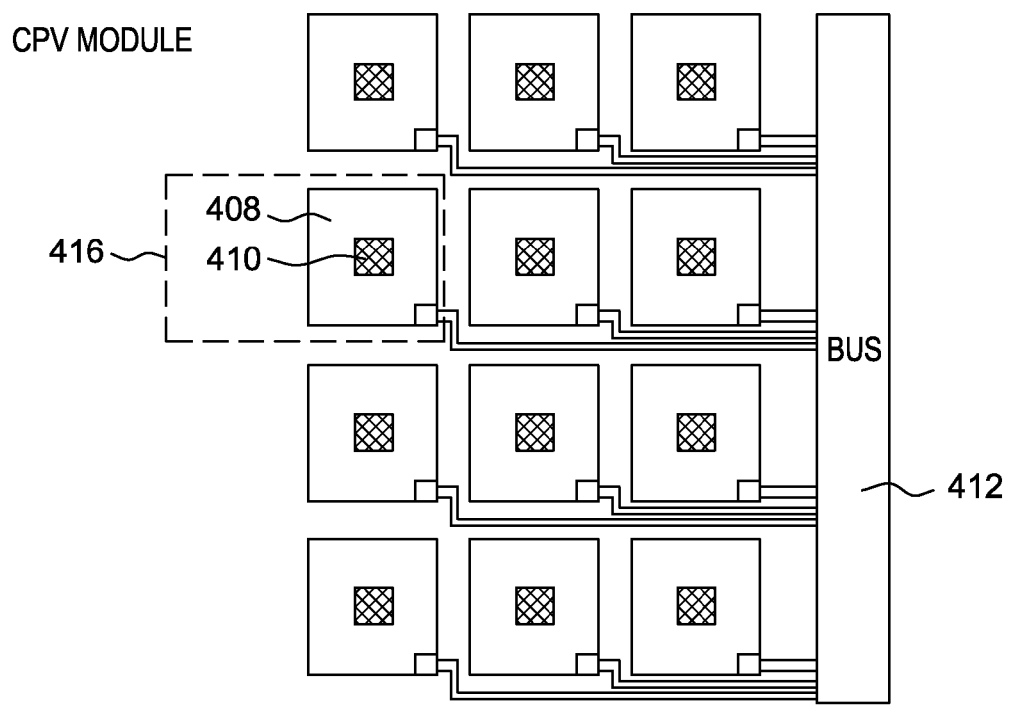
FIG. 4b illustrates a concentrated solar module separated into pixels, in accordance with an embodiment of the present invention.

FIG. 4b illustrates a concentrated solar module separated into pixels or square cells, in accordance with an embodiment of the present invention. Concentrated photovoltaic (CPV) modules, in the illustrative example, use tiny lenses to concentrate a large amount of sunlight onto a small area of solar absorber material. In a concentrated solar module, the ratio of absorber material area of diode 410 to the area used by ECU 408 may be much lower without sacrificing efficiency. This configuration allows for more surface area for integrated devices on the solar module. The solar cell module is separated into a plurality of pixels. Each pixel having a solar cell diode connected to a single electronic conversion unit manufactured on a single substrate. For example, diode 410 and ECU 408 are manufactured on a single substrate. Each pixel connects through wiring to a power collecting layer, such as collector bus 412. Collector bus 412 may be a standard DC bus passing DC current from all the pixels. For example, ECU 408 includes an integrated micro-inverter for power conversion and MPPT manufactured on a single substrate as diode 410 in solar cell 416. The micro-inverter performs MPPT on diode 410 to provide the maximum DC current possible given any limitations of diode 410.

Sequential steps of an exemplary embodiment of a method for manufacturing a transistor, inductor, and capacitor on a thin film solar cell diode substrate collectively are described below with respect to the schematic illustrations of FIGS. 5-11. Similar reference numerals denote similar materials.

Figure 5:
FIG. 5 depicts a substrate, upon which embodiments of the present invention may be fabricated.

FIG. 5 depicts a substrate, substrate 602, upon which embodiments of the present invention may be fabricated. Thin film solar cells and thin film transistors may start with a non-conducting substrate such as soda-lime glass or polyimide film. In the illustrative embodiment of FIG. 5, substrate 602 is a soda-lime glass of 1-3 mm thickness. In another embodiment, substrate 602 may be a flexible sheet of steel foil.

Figure 6A:
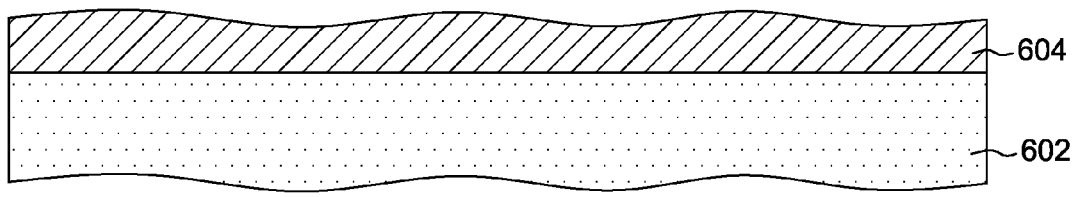
FIG. 6a depicts the deposition of a backside electrode material, in accordance with an illustrative embodiment.

FIG. 6a depicts the deposition of a backside electrode material, metal 604, in accordance with an illustrative embodiment. Metal 604 may be a transparent conductive oxide (TCO) layer or a metal layer. TCO materials may comprise zinc oxide (ZnO), tin oxide ($SnO_2$), tin doped indium oxide (ITO), or indium oxide ($In_2O_3$). Metal materials may comprise Mo, Cu, Al, Ag or other suitable metals or alloys. In the illustrative embodiment of FIG. 6a, deposition of a molybdenum (Mo) layer, metal 604, through sputtering serves as a backside electrode and also reflects most unabsorbed light back into absorber 608 material of solar cell diode 620 (as seen in the final device illustrated in FIG. 11).

Figure 6B:
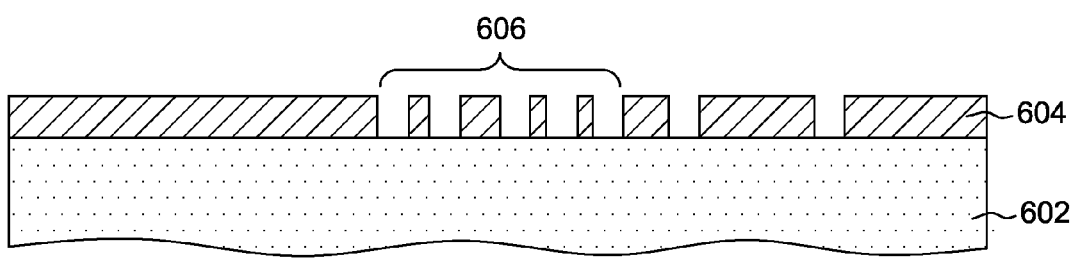
FIG. 6b depicts segmentation of the backside electrode material, and the formation of inductance coil channels in a coil area, in accordance with an illustrative embodiment.

FIG. 6b depicts segmentation of the backside electrode material, metal 604, and the formation of inductance coil channels in coil area 606, in accordance with an illustrative embodiment. The segmentation process creates a first segment of the backside electrode material to form a backside electrode for the thin film solar cell. A second segment of the backside electrode material is created to form a backside electrode for a capacitor of the ECU. A third segment of the backside electrode material is created, wherein the third segment forms a bottom gate for a transistor, which may be fabricated as either a bottom gate transistor, or a dual gate transistor. In the case of a top gate transistor, no third segment is created, as in the example of MOSFET/transistor 622. Additionally multiple consecutive segments of the backside electrode material may be utilized to form an inductor, i.e., inductance coil 624. Segmentation of the Mo layer can be accomplished via a laser scribe process, thereby forming the backside electrode on a typical solar cell, or backside contacts for solar cell strings. In an embodiment of the present invention, the Mo layer may be segmented through Nanoimprint Lithography (NIL) to form the backside electrode of solar cell diode 620 and the first layer of inductance coil 624 (as seen in the final device illustrated in FIG. 11). The NIL process may use a spin coated resist (typically a thermoplastic polymer) on the substrate which is physically imprinted with the design using a mold under pressure. Reactive ion etching transfers the pattern of openings in the resist onto the exposed layer, in this case metal 604. After etching, the remaining resist is removed to reveal the first layer of coil area 606, the backside electrode of solar cell diode 620, and the bottom gate for MOSFET/transistor 623.

Figure 7A:
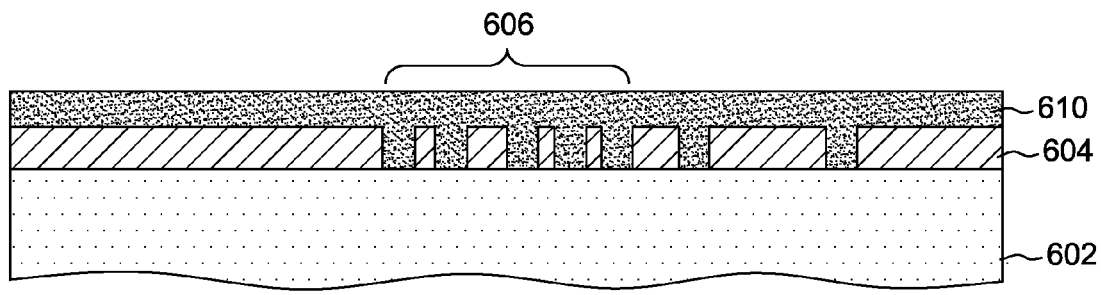
FIGS. 7a through 7d illustrate the deposition and selective removal of a first insulator material, in accordance with an illustrative embodiment.
Figure 7B:
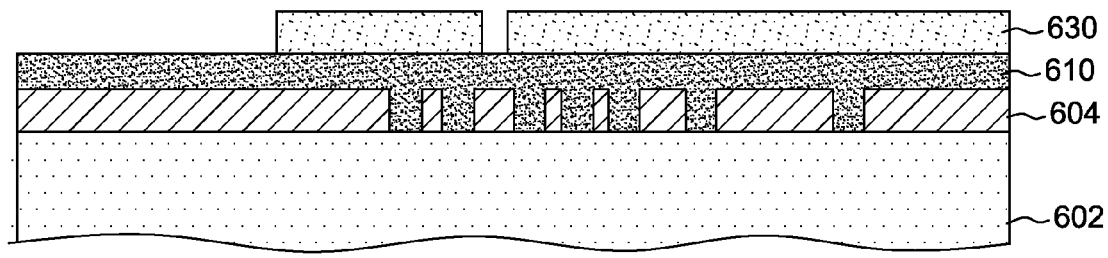
Figure 7C:
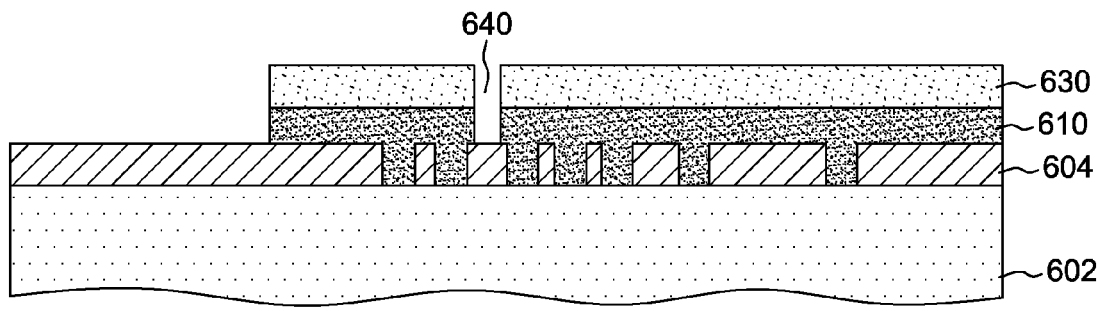
Figure 7D:
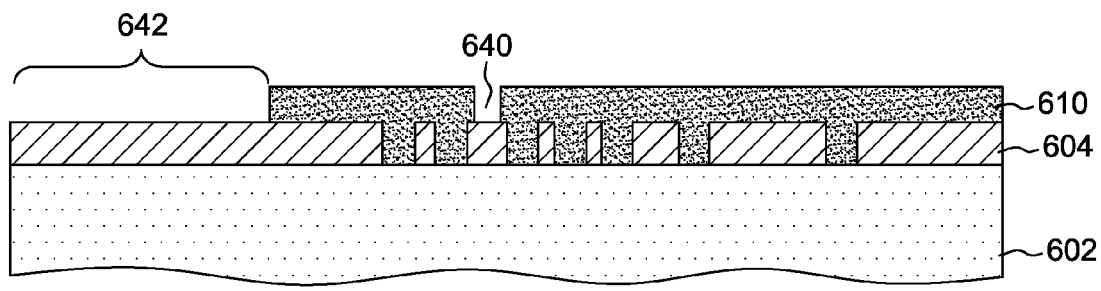

FIGS. 7a through 7d illustrate the deposition and selective removal of a first insulator material, insulator 610, in accordance with an illustrative embodiment. Insulator 610 may comprise a metal oxide with dielectric properties, such as aluminum oxide (Al2O3) or silicon dioxide (SiO2), or a hard baked photoresist. In FIG. 7a, insulator 610 is deposited over the backside electrode material in the form of $Al_2O_3$ by various techniques, such as plasma-enhanced chemical vapor deposition (PECVD), or reactive sputtering. Lithography steps, such as the NIL process, may be used to selectively remove the $Al_2O_3$ layer. FIG. 7b shows a resist layer, etch mask 630, which has been imprinted. In FIG. 7c, two openings are etched into the first insulator material to expose portions of the backside electrode. Reactive ion etching transfers the pattern of openings in etch mask 630 onto the exposed layer, in this case insulator 610. FIG. 7d shows insulator 610 after removal of etch mask 630, and reveals dielectric material removed down to metal 604 to form via 640 and absorber area 642. Absorber area 642 forms an opening for solar cell diode 620. Via 640 forms an opening that will be used later to connect inductance coil 624 to the final circuit. Insulator 610 deposits down into the channels of coil area 606 for formation of inductance coil 624. Insulator 610 also forms the dielectric layer for proper formation of capacitor 626 (as seen in the final device illustrated in FIG. 11).

Figure 8A:
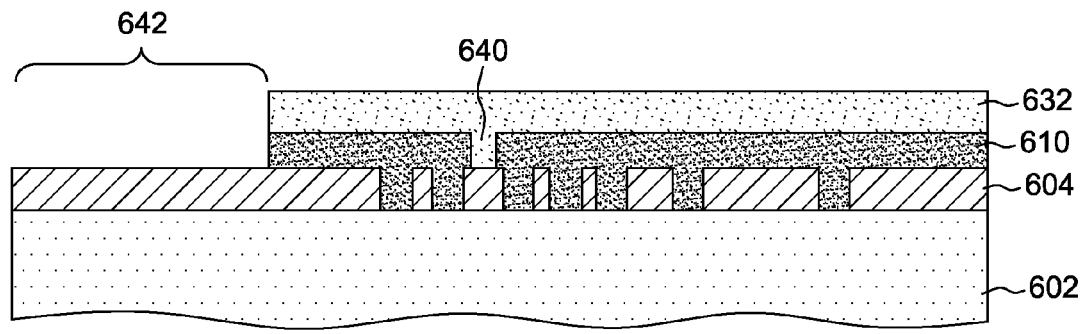
FIGS. 8a and 8b depict the selective deposition of a semiconductor absorber material, in accordance with an illustrative embodiment.
Figure 8B:
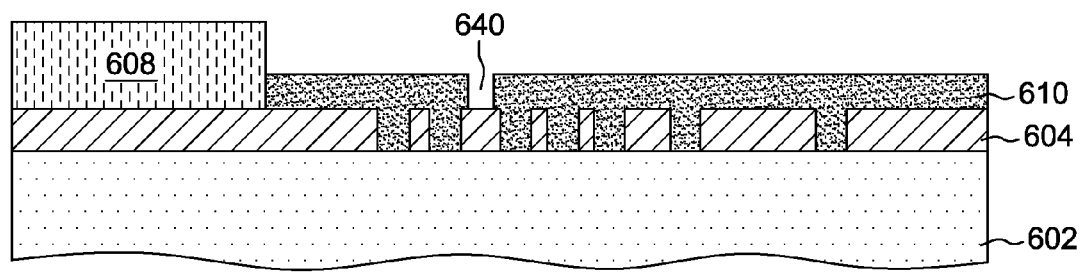

FIGS. 8a and 8b depict the selective deposition of a semiconductor absorber material, absorber 608, in accordance with an illustrative embodiment. A semiconductor absorber material is deposited on the exposed portion of the backside electrode to create a solar cell diode of the thin film solar cell. In FIG. 8a, mask 632 protects via 640 and remaining areas of insulator 610 during CIGS metal depositions. For proper formation of inductance coil 624, absorber 608 material is prevented from entering via 640, which was formed in insulator 610, by mask 632. The opening in mask 632 at absorber area 642 allows for formation of solar cell diode 620. Mask 632 may include a lift off mask, or sacrificial photoresist layer created using conventional photolithography methods, or any other suitable protecting mask. Absorber 608 may be composed of any semiconducting absorber material used in thin film solar cells such as a-Si, amorphous silicon alloy, CIGS, CdS, CuInSe$_2$ (CIS), cadmium telluride (CdTe), copper zinc tin sulfide/selenide (CZTS), and specialized organic photovoltaics (OPV). In the manufacture of thin film solar cells, absorber 608 is typically 1 to 5 micrometers thick. In other embodiments, the thickness of absorber 608 may be greater than 5 micrometers or less than 1 micrometer. Absorber 608 may be deposited in a variety of ways, such as coevaporation of multiple metals, sputtering of stacked metallic layers, printing of inks comprised of nanoparticles, and electrodeposition. In the illustrative embodiment, the metals Cu, In, and Ga are co-evaporated in a vacuum at 550 C, or co-sputtered in a vacuum at a much lower temperature, and then subsequently annealed in a Se atmosphere at high temperature to form a CIGS absorber in absorber area 642. Another method of CIGS absorber formation involves stacking layers of metal by sequential sputtering of Cu/In/Ga/Cu/In/Ga layers with subsequent reaction in a Se atmosphere. In some methods, a chemical bath deposition process deposits a thin n-type buffer layer, such as CdS, on top of the CIGS absorber material.

FIG. 8b shows absorber 608 after mask 632 has been removed. Absorber 608 becomes a diode, like solar cell diode 620. Mechanical or laser scribing processes may further segment absorber 608 into multiple diodes, if not already segmented with the lithography process. The diodes may be formed in string, pixel, or other formats to form the basis of a solar sub-module or solar module as needed. Via 640 is clear of any semiconductor absorber material.

Figure 9:
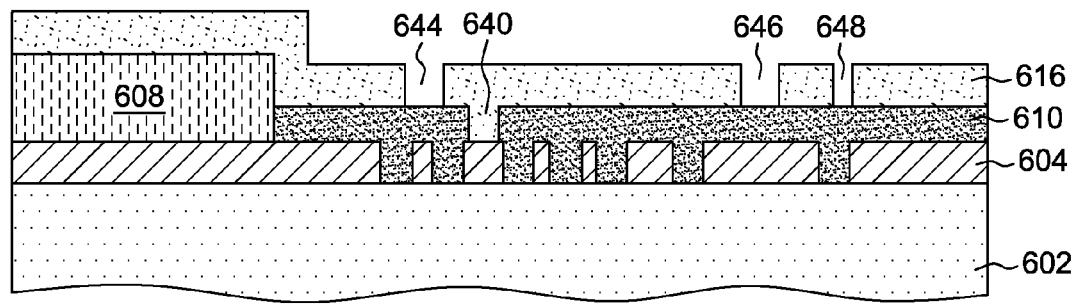
FIG. 9 depicts the deposition and selective removal of a transparent conducting material made of a transparent conducting oxide, in accordance with an illustrative embodiment.

FIG. 9 depicts the deposition and selective removal of a transparent conducting material made of a transparent conducting oxide (TCO), i.e., TCO 616, in accordance with an illustrative embodiment. A transparent conducting material is deposited over the semiconductor absorber material and the first insulator material. TCO 616 may comprise a transparent doped metal oxide, such as tin doped indium oxide (ITO), intrinsic zinc oxide (i-ZnO), aluminum doped zinc oxide (ZnO:Al), or indium-doped cadmium oxide. TCO 616 may be deposited on a substrate through various deposition methods, such as metal organic chemical vapor deposition (MOCVD), metal organic molecular beam deposition (MOMBD), spray pyrolysis, pulsed laser deposition (PLD), and magnetron sputtering. In the illustrative embodiment, a layer i-ZnO followed by a thicker layer of ZnO:Al is deposited on the device for TCO 616. Segmentation of TCO 616 may happen through lithography steps and etching processes, either wet or dry etching. A first segment of the transparent conducting material forms a topside electrode for capacitor 626 to the right of opening 648. One or more openings are etched through the transparent conducting material to expose a portion of the first insulator material. In FIG. 9, TCO 616 provides the electrical connection to the gates for MOSFET/transistor 622 and 623 at openings 644 and 646. TCO 616 provides an interconnection at via 640 for inductance coil 624. TCO 616 provides the front side electrodes for both solar cell diode 620 and capacitor 626 (as seen in the final device illustrated in FIG. 11).

Figure 10A:
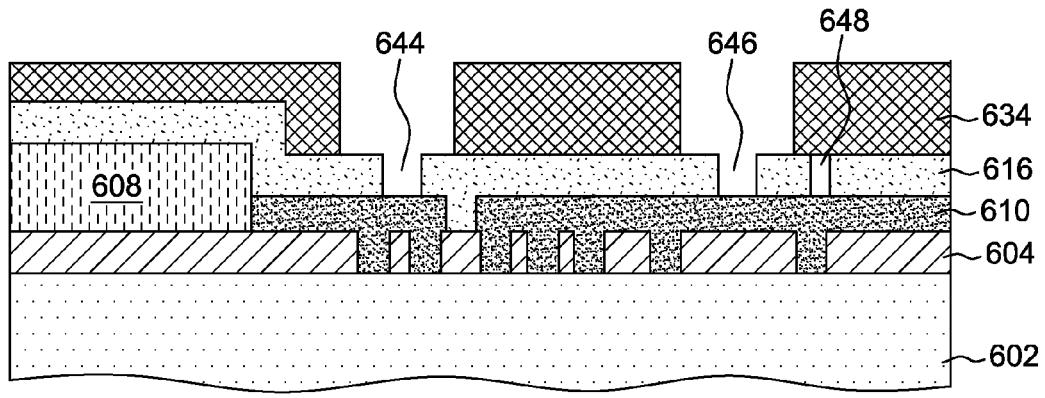
FIGS. 10a and 10b depict the selective deposition of a semiconducting transistor material, in accordance with an illustrative embodiment.
Figure 10B:
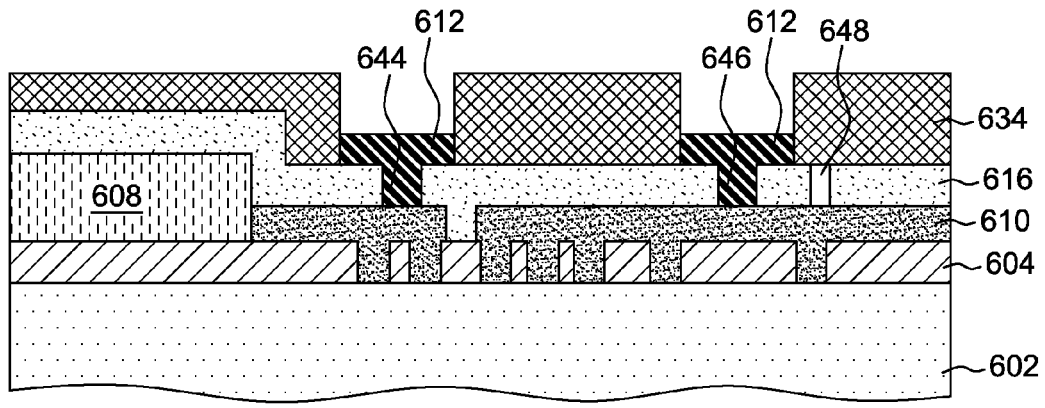

FIGS. 10a and 10b depict the selective deposition of a semiconducting transistor material, semiconductor 612, in accordance with an illustrative embodiment. A semiconducting transistor material is deposited in the one or more openings of the transparent conducting material and onto the exposed portions of the first insulator material, such that the semiconducting transistor material is electrically connected to the solar cell diode by the transparent conducting material. In a preferred embodiment of the present invention, semiconductor 612 is deposited as an amorphous oxide semiconductor (AOS), such as amorphous InGaZnO (a-IGZO), by sputtering from a target or by room temperature pulsed laser deposition. Lithography steps are used to structure the a-IGZO layer as in FIGS. 10a and 10b. NIL processes may be used to structure large areas with nanoscale resolution. FIG. 10a shows the patterned resist layer, mask 634, before deposition. The mask is structured to prevent multiple layers of transistor material covering specified areas of TCO 616, as in FIGS. 10a through 10e. FIG. 10b shows the substrate after deposition of semiconductor 612 down into locations 644 and 646. The a-IGZO layer provides the first semiconducting layer of MOSFET/transistor 622 and 623 (as seen in the final device illustrated in FIG. 11).

Figure 10C:
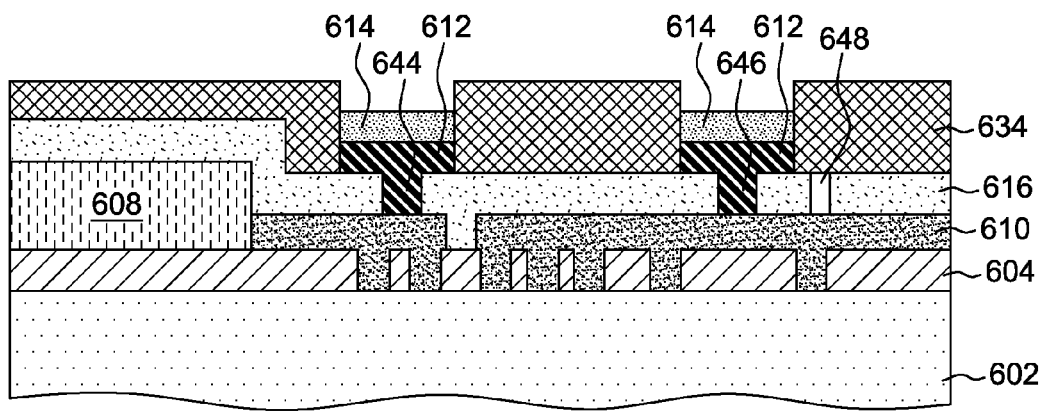
FIG. 10c depicts the selective deposition of a second insulator material layer, in accordance with an illustrative embodiment.

FIG. 10c depicts the selective deposition of a second insulator material, insulator 614, in accordance with an illustrative embodiment. A second insulator material is deposited onto the semiconducting transistor material. Insulator 614 may comprise a layer of metal oxide with dielectric properties, such as $Al_2O3$ or $SiO_2$, or a hard baked photoresist. Insulator 614 is deposited by various techniques, such as plasma-enhanced chemical vapor deposition (PECVD), or reactive sputtering. In the illustrative embodiment of FIG. 10c, lithography steps may be used to selectively deposit an $Al_2O3$ layer. In FIG. 10c, mask 634 from the preceding step continues to define locations 644 and 646 for deposition of insulator 614. Insulator 614 provides the dielectric or gate insulation for MOSFET/transistor 622 and 623.

Figure 10D:
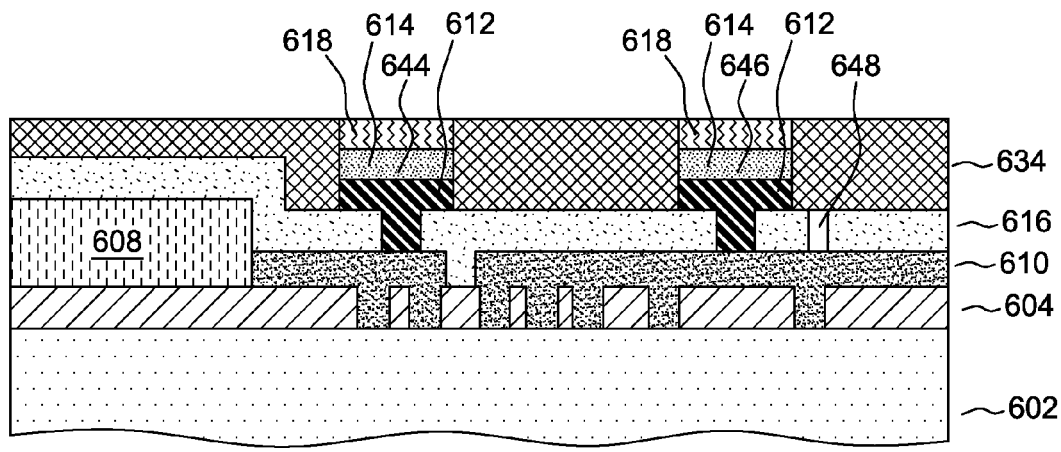
FIG. 10d depicts the formation of a conducting top electrode, in accordance with an illustrative embodiment.
Figure 10E:
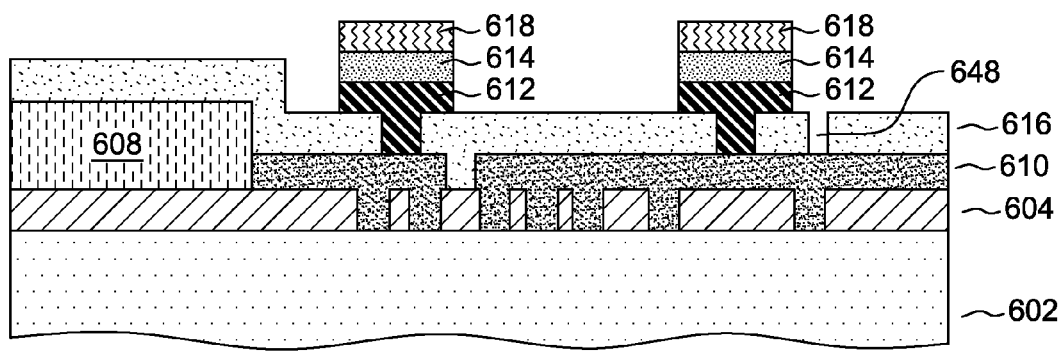
FIG. 10e depicts the layers for a MOSFET/transistor after removal or lift off of a mask.

FIG. 10d depicts the formation of a conducting top electrode, metal grid 618, in accordance with an illustrative embodiment. Metal 618 may be Au, Ag, or Ni/Al metal sputtered on top of the TCO 616 layer. Metal grid 618 provides the top gates for MOSFET/transistor 622 and 623. In some embodiments, the top gates may be TCO 616 alone, but metal grid 618 improves conductivity. In a preferred embodiment of the present invention, metal grid 618 is deposited by Al sputtering with an etch mask as in FIG. 10d. In FIG. 10d, mask 634 from the preceding step continues to define locations 644 and 646 for deposition of metal grid 618. A conducting top electrode is deposited onto the second insulator material to create a transistor of the ECU in electrical connection with the solar cell diode. FIG. 10e depicts the finished layers for MOSFET/transistor 622 and 623 after removal or lift off of mask 634.

Figure 11:
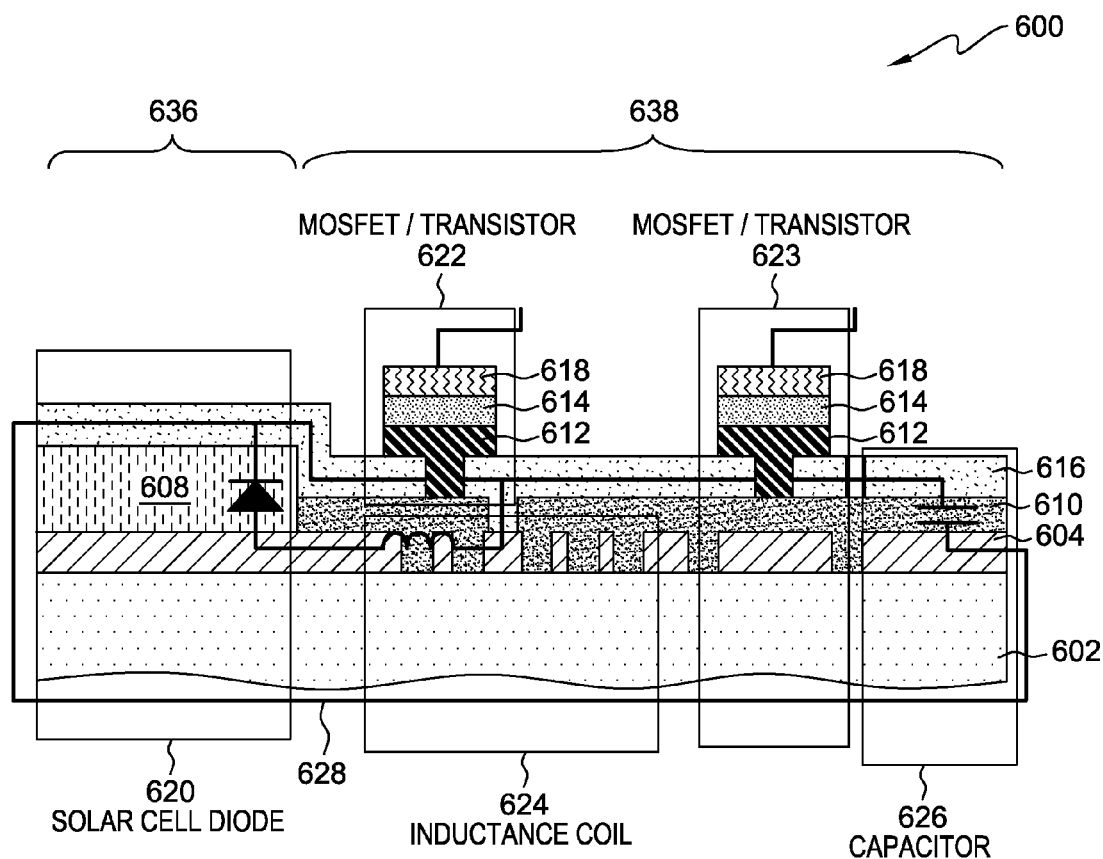
FIG. 11 depicts a thin film solar cell and thin film micro-inverter device on a single substrate, in accordance with an illustrative embodiment.

FIG. 11 depicts an integrated thin film solar cell and electronic conversion unit on a single substrate, device 600, in accordance with an illustrative embodiment of the present invention. Device 600 comprises solar cell diode 620, MOSFET/transistor 622, MOSFET/transistor 623, inductance coil 624, and capacitor 626 which are integrated monolithically on substrate 602. The thin film solar cell is in area 636, and the electronic conversion unit is in area 638. A box around the specific layers illustrates each component. Many different energy conversion circuit designs are possible using different combinations and quantities of the devices from the illustration. Low loads, such as milliwatt loads, and high frequency switching allow the inductance and capacitance to be suitable for integration into the substrate of device 600. In some designs, inductance coil 624 and capacitor 626 may be missing while the number of transistors, such as MOSFET/transistor 622, increases.

Circuit 628 shows a simplistic pathway for current passing through all components of device 600. To build a "boost" or buck" converter, one MOSFET/transistor may be connected to the backside electrode. A network of wires connects the gates and collects the converted current using three leads on each solar cell or diode pixel. The wiring may be provided in separate layers underneath the back electrode of solar cell diode 620.

Figure 12:
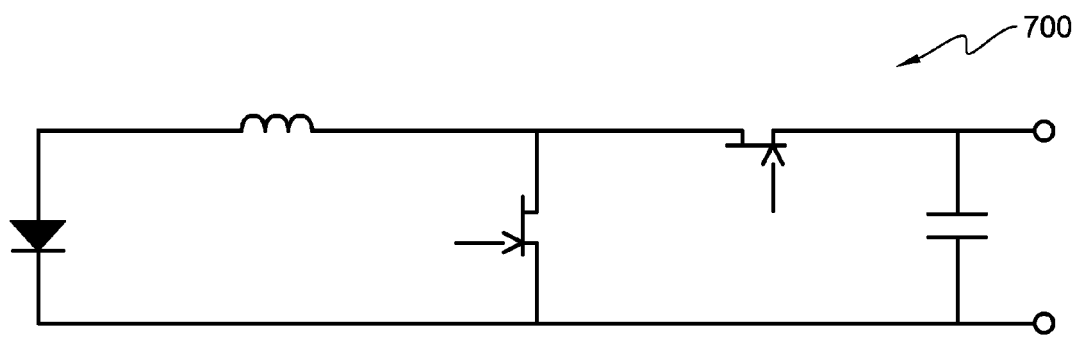
FIG. 12 illustrates control circuitry to shape an output waveform, in accordance with an embodiment of the present invention.

FIG. 12 illustrates control circuitry to shape an output waveform, in accordance with an embodiment of the present invention. Circuit 700 shows an electrical circuit diagram representing device 600 of FIG. 11 comprising wiring, a diode, two transistors, an inductor, and a capacitor. In an embodiment of the present invention, a micro-inverter circuit containing at least one diode, one inductor coil, one capacitor, and two MOSFET/transistors allow for waveform shaping. The transistors act as switches to change the circuit connection of individual diodes by adding one to a series connection, or disconnecting one from a series connection allowing the solar module to meet a target voltage or create a DC waveform with a target frequency.

MOSFET/transistor 622 or 623 designs may include a top gate electrode, bottom gate, planar, stacked, or with fins. Capacitor 626 may be created from two conducting layers with an insulator material in between. In the present invention, capacitors may take the form of metal-insulator-metal (MIM), or metal-oxide-metal (MOM), wherein materials are compatible with the manufacturing processes of the thin film solar cell. In another embodiment, planar supercapacitors may be fabricated with an interdigitated electrode layer.

Standard thin film solar module finishing processes may be applied over the resulting integrated substrate. An antireflection coating (ARC) reduces losses from light reflected off the surface of the solar cell. Single-layer and double-layer antireflection coatings are allowable. Single-layer coatings may include silicon dioxide ($SiO_2$), titanium dioxide ($TiO_2$), or silicon nitride. Double-layer coatings may include $MgF_2/ZnS$, $MgF_2/TiO_2$, $SiO_2/MgF_2$, $SiO_2/SiN_x$, or $MgF_2/CeO_2$. Coatings may be deposited using standard chemical vapor deposition processes. After the antireflective coating, solar modules may be encapsulated with a transparent protective cover, such as glass or polymer film, to protect the cells from moisture, debris, hail damage, etc., coming from the physical environment. For example, ethylene tetrafluoroethylene (ETFE) is a fluorinated polymer nonstick film used in the solar industry for the back and front cover sheets of thin film solar modules.

Having described preferred embodiments for integrating power conversion circuits with thin film solar cells on a substrate (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. A solar cell module, comprising:
an array of thin film solar cells formed on a substrate, the substrate having a multitude of backside electrode segments directly on the substrate, a layer of an insulating material directly on the multitude of backside electrode segments and the substrate, and a layer of transparent conducting material directly on the layer of insulating material, the multitude of backside electrode segments, the layer of an insulating material and the layer of transparent conducting material forming a multi-layer stack;
at least one solar cell diode monolithically integrated within each thin film solar cell of the array on the substrate, a first of the multitude of backside electrode segments forming the at least one solar cell diode; and
an electronic conversion unit (ECU) monolithically integrated within each thin film solar cell of the array on the substrate, each ECU having at least one transistor formed with a second of the multitude of backside electrode segments, each ECU being electrically connected with the at least one solar cell diode within each respective thin film solar cell of the array, the solar cell diode formed with a third of the multitude of backside electrode segments, each ECU contains at least one capacitor monolithically integrated on the substrate formed with a fourth of the multitude of backside electrode segments, each ECU contains at least one inductor monolithically integrated on the substrate formed with a fifth of the multitude of backside electrode segments, and each ECU being electrically connected to a microcontroller on the solar cell module, the first, second, third, fourth and fifth backside electrode segments being defined by the layer of insulating material separating the backside electrode segments from each other.

2. The solar cell module of claim 1, wherein the array solar cells are connected in series.

3. The solar cell module of claim 1, wherein the solar cell module is separated into a plurality of pixels, each pixel formed from the solar cells of the array.

4. The solar cell module of claim 1, further comprising a microcontroller connected to each ECU and integrated monolithically with the array thin film solar cells on the substrate.

5. The solar cell module of claim 1, wherein each ECU comprises a micro-inverter circuit which performs one or more of: maximum power point tracking (MPPT), power conversion, and power conditioning, at a solar cell level.

6. The solar cell module of claim 4, wherein the microcontroller comprises a circuit connected to the ECU which performs one or more of: pulse width modulation (PWM), MPPT, power conversion, and power conditioning, at a solar sub-module or solar module level.

7. The solar cell module of claim 4, wherein a combination of one or more of the ECU's and one or more of the microcontrollers act as a main controller performing PWM, power conversion, and power conditioning prior to passing an output to a public grid or a current using device.

8. The solar cell module according to claim 1, wherein the layer of transparent conducting material electrically connects each ECU and the respective thin film solar cell of the array.

* * * * *